United States Patent
Tobe et al.

(10) Patent No.: US 7,078,357 B2
(45) Date of Patent: Jul. 18, 2006

(54) METHOD FOR MANUFACTURING SILICON WAFER AND SILICON WAFER

(75) Inventors: Satoshi Tobe, Annaka (JP); Ken Aihara, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 143 days.

(21) Appl. No.: 10/415,127

(22) PCT Filed: Oct. 22, 2001

(86) PCT No.: PCT/JP01/09239

§ 371 (c)(1),
(2), (4) Date: Apr. 25, 2003

(87) PCT Pub. No.: WO02/35599

PCT Pub. Date: May 2, 2002

(65) Prior Publication Data

US 2004/0102056 A1    May 27, 2004

(30) Foreign Application Priority Data

Oct. 25, 2000    (JP)    .............................. 2000-325986

(51) Int. Cl.
*H01L 21/324*    (2006.01)
(52) U.S. Cl. ..................................... 438/795
(58) Field of Classification Search ................. 438/795;
117/105–109; 29/25.01
See application file for complete search history.

(56) References Cited

U.S. PATENT DOCUMENTS

| 5,403,406 A | 4/1995 | Falster et al. ............... 148/33.2 |
| 5,674,756 A | 10/1997 | Satoh et al. .................. 437/10 |
| 5,994,761 A | 11/1999 | Falster et al. ................ 257/611 |
| 6,143,071 A | 11/2000 | Aihara et al. .................. 117/89 |
| 6,245,311 B1 | 6/2001 | Kobayashi et al. ......... 423/348 |

FOREIGN PATENT DOCUMENTS

| EP | 0 964 443 | 12/1999 |
| EP | 0 971 055 | 1/2000 |
| JP | 8-45945 | 2/1996 |
| JP | 10-144696 | 5/1998 |
| JP | 2001-509319 | 9/1998 |
| JP | 11-67781 | 3/1999 |
| JP | 11-354529 | 12/1999 |
| JP | 2000-31150 | 1/2000 |
| WO | 92/09101 | 5/1992 |
| WO | 6-504878 | 6/1994 |
| WO | 98/38675 | 9/1998 |

*Primary Examiner*—Richard A. Booth (74) *Attorney, Agent, or Firm*—Wenderoth, Lind & Ponack, L.L.P.

(57) ABSTRACT

There are provided a heat-treating method capable of both increasing BMD density and widening DZ layer width, and a silicon wafer having DZ layer width wider compared with a conventional one regardless of high BMD density. In the method, heat treatment (RTA treatment) is performed to a silicon wafer containing interstitial oxygen with a rapid heating-rapid cooling apparatus, thereby atomic vacancies being injected from a surface of the wafer to form a maximum position of an atomic vacancy concentration in a depth direction in the vicinity of the surface of the wafer, and thereafter heat treatment (post annealing) is performed to move the maximum position of the atomic vacancy concentration in the vicinity of the surface of the wafer into the inside of the wafer.

4 Claims, 5 Drawing Sheets

METHOD FOR MANUFACTURING SILICON WAFER AND SILICON WAFER

This application is a U.S. national stage of International Application No. PCT/JP01/09239 filed Oct. 22, 2001.

TECHNICAL FIELD

The present invention relates to a method for manufacturing silicon wafer capable of both increasing BMD (Bulk Micro-Defect) density and widening DZ (Denuded Zone) layer width, and to a silicon wafer having DZ layer width wider compared with a conventional one.

BACKGROUND ART

Oxygen (interstitial oxygen) is considerably mixed into a silicon single crystal produced by means of a Czochralski (CZ) method due to the use of a quartz crucible. It has been known that this oxygen is to become precipitates during crystal production and during heat treatment in a device fabrication process subsequent to slicing the crystal into wafers and processing the wafers.

If crystal defects such as oxide precipitates reside in a device active region, the crystal defects work as a cause for reducing device yields; therefore, it is necessary to form as a device active region a so-called DZ layer where crystal defects are eliminated. On the other hand, if BMDs such as oxide precipitates have been generated in the inside (a bulk portion) of a substrate, the defects bring about an improvement effect of gettering capability for heavy metal impurities. From these viewpoints, it is very important to control an amount of oxide precipitates (control of oxygen precipitation characteristics) in a silicon wafer.

DZ layer width and BMD density are in an inverse correlation; it has been known heretofore that simultaneous increase in BMD density and DZ layer width is impossible in any kind of single stage heat treatment.

While, in recent years, as heat treatment for increase in BMD density, heat treatment using a rapid heating-rapid cooling apparatus (such heat treatment is hereinafter referred to as RTA: Rapid Thermal Annealing) has been known (for example, U.S. Pat. No. 5,994,761). The fact of decrease in DZ layer width with increase in BMD density still remains unavoidable in RTA similarly to prior art heat treatment; there arises difficulty in fabrication and design of a device.

DISCLOSURE OF THE INVENTION

It is accordingly an object of the present invention to provide a heat treatment method capable of both increasing BMD density and widening DZ layer width, and to attain a silicon wafer having DZ layer width wider compared with a conventional one regardless of high BMD density.

A method for manufacturing a silicon wafer of the present invention comprises the steps of performing heat treatment (RTA treatment) to a silicon wafer containing interstitial oxygen with a rapid heating-rapid cooling apparatus, thereby atomic vacancies being injected from a surface of the wafer to form a maximum position of an atomic vacancy concentration in a depth direction in the vicinity of the surface of the wafer, and performing heat treatment (post annealing) to move the maximum position of the atomic vacancy concentration in the vicinity of the surface of the wafer into the inside of the wafer.

In this case, the RTA treatment is preferably performed at a temperature higher than an optimal temperature at which an amount of precipitated oxygen or BMD density is maximized. Note that "an optimal temperature at which an amount of precipitated oxygen or BMD density is maximized" means an RTA treatment temperature at which an amount of precipitated oxygen or BMD density detected by performing oxygen precipitation heat treatment after application of RTA treatment only has the maximum value at a specified depth in the bulk. As oxygen precipitation heat treatment, there is commonly adopted two stage heat treatment, for example, including 800° C., 4 hrs+1000° C., 16 hrs, or 900° C., 4 hrs+1000° C., 16 hrs. There is a possibility that the optimal temperature changes according to an initial oxygen concentration of a wafer subjected to the RTA treatment, an RTA treatment time and others, which can be empirically obtained in advance.

To be concrete, with plural silicon wafers (wafers with the same specification) prepared under the same conditions as the silicon wafer containing interstitial oxygen used in the present invention, each wafer thereof is subjected to the RTA treatment at respective plural different temperatures selected in a temperature range of 1100° C. to 1350° C. and thereafter oxygen precipitation treatment is applied to each of the silicon wafers subjected to the RTA treatments to obtain a relationship between the amount of precipitated oxygen or the BMD density and an RTA treatment temperature, so that an optimum temperature at which an amount of precipitated oxygen or BMD density is maximized is determined from the relationship.

In order to effectively inject atomic vacancies into a wafer from a surface thereof, the RTA treatment is preferably performed in atmosphere containing nitrogen and a heat treatment temperature is preferably in the range of 1100 to 1350° C. because sufficient injection of atomic vacancies cannot be attained at a temperature lower than 1100° C., while at a temperature higher than 1350° C., there is a fear for generation of slip dislocation and heavy metal contamination from an apparatus.

Since the RTA treatment is commonly performed with a single wafer processing, heat treatment for such a long time as exceeding 120 sec is not preferable, which reduces the productivity to an extremely low level. On the other hand, heat treatment for such a short time as less than 1 sec cannot achieve sufficient injection of the atomic vacancies.

If the post annealing is performed at a temperature lower than 700° C., atomic vacancies injected in a surface region of a wafer cannot outdiffuse sufficiently, which makes it hard to widen DZ layer width, while if it is performed at a temperature in excess of 1050° C., injection of atomic vacancies from a wafer surface is again started, which similarly makes it hard to widen DZ layer width. Accordingly, a temperature for the post annealing is preferably in the range of 700 to 1050° C.

A heat treatment time for the post annealing is preferably on the order of 30 min to 5 hrs. If the heat treatment time is less than 30 min, outdiffusion of atomic vacancies in the vicinity of a wafer surface becomes insufficient, which makes it hard to achieve an effect of widening DZ layer width. If the heat treatment time exceeds 5 hrs, there is not only reduction in productivity, but also increase in outdiffusion of atomic vacancies; there is a risk of decrease in BMD density in the inside of a wafer.

Further, the post annealing is not a heat treatment where a silicon wafer is loaded into or unloaded from a heat treatment furnace kept at a specific temperature in the range of 700 to 1050° C., that is, where a wafer is loaded into a heat treatment furnace kept at a temperature lower than a temperature at which the post annealing is performed, followed by ramping up the temperature to a target temperature, but the post annealing is preferably performed such that the heat treatment furnace is adjusted to an annealing temperature in advance, into which a wafer is loaded for the annealing. The reason is that when the ramping up is performed, during the ramping up oxygen precipitation nuclei are generated in a region where a DZ layer is to be formed, so that sufficient DZ layer width may not be achieved in some cases.

In the method of the present invention, it is preferable to use a CZ silicon wafer which has the entire surface composed of an N-region as a silicon wafer containing interstitial oxygen to be heat-treated. Using such a wafer, there can be obtained a silicon wafer having a high quality DZ layer in which not only defects caused by oxide precipitates but also grown-in defects of a void type are absent.

According to the method of the present invention, there can be attained a silicon wafer where a maximum value of the BMD density in the bulk is $4 \times 10^{10}/cm^3$ or more and the DZ layer width is 15 μm or more, that is, a silicon wafer where high BMD density and a DZ layer with wide width are compatible. Furthermore, there can be obtained a silicon wafer having a high quality DZ layer in which density of COPs of 0.1 μm or more in diameter is 0.2 pieces/cm² or less.

In a silicon wafer of the present invention, the maximum value of BMD density in the bulk is $4 \times 10^{10}/cm^3$ or more and DZ layer width is 15 μm or more.

In this case, considering mechanical strength of a wafer, the BMD density is preferably $1 \times 10^{12}/cm^3$ or less, and a wafer with DZ layer width of 50 μm or less can be sufficiently applicable to various kinds of devices.

It is preferable that density of COPs of 0.1 μm or more in diameter present on a surface of the silicon wafer is 0.2 pieces/cm² or less.

BEST MODE FOR CARRYING THE INVENTION

Description will be given of embodiments of the present invention with reference to the accompanying drawings and it is needless to say that various modifications thereof can be implemented without departing from the concept of the present invention.

As for silicon wafers used in the present inventive method, while no specific limitation is imposed on a manufacturing method thereof as far as they are silicon single crystal wafers containing interstitial oxygen, there are usually used silicon wafers manufactured from a silicon ingot pulled by means of a CZ method. When using a CZ method, the silicon single crystal wafers inevitably contains interstitial oxygen of the order of 10 ppma or more (JEIDA (Japan Electronic Industry Development Association) standards). Using a so-called MCZ method in which a silicon single crystal ingot is pulled under application of a magnetic field, in the silicon single crystal wafer manufactured from the ingot an interstitial oxygen concentration can be reduced, but even in this case interstitial oxygen of the order of several ppma may be introduced into the wafer.

In order to achieve high BMD density and a wide DZ layer, which is an object of the present invention, it is preferable to use a CZ silicon wafer with an initial interstitial oxygen concentration of the order of 10 to 20 ppma (JEIDA). It is not especially difficult to control the initial interstitial oxygen concentration within this range and for the purpose it is enough, as is commonly performed, to properly adjust parameters such as a rotation number of a crucible, an introduction gas flow rate, an ambient pressure, a temperature distribution of a melt, convection thereof and others.

In order to attain a silicon wafer with a high quality DZ layer in which there are neither defects due to oxide precipitates nor grown-in defects of a void type (called COP (crystal originated particle) when exposed on a wafer surface), it is enough to use a CZ silicon wafer which has the entire surface composed of an N-region and is manufactured from a single crystal ingot pulled under pulling conditions for suppressing generation of the defects of a void type to the lowest possible level.

Brief description will be here given of the N-region. When a pulling rate is high in pulling a silicon signal crystal by means of a CZ method, defects of a void type (called COP, FPD, LSTD and others) due to atomic vacancies are incorporated into a crystal and a region including such defects is called a V-rich region (V means Vacancy). On the other hand, when the pulling rate is low, there are incorporated defects due to interstitial silicon such as dislocation loops and dislocation clusters and a region including such defects is called an I-rich region (I means Interstitial-Si). And there is called an N-region (N means Neutral) a region that is at an intermediate point between the V-rich region and the I-rich region and where defects of a void type and defects due to dislocations are hardly generated.

In order to manufacture a wafer having the entire surface composed of an N-region, it has been known that a crystal is preferably pulled by properly adjusting F/G that is a ratio between a pulling rate F of a crystal and a temperature gradient G in a grown crystal in the vicinity of a solid-liquid interface in a CZ method (see, for example, JP A 99-79889).

The method of the present invention is such that a silicon wafer containing interstitial oxygen described above is subjected to RTA treatment, followed by post annealing. Post annealing in the method of the present invention is different from oxygen precipitation heat treatment for growing oxygen precipitation nuclei (for example, long time heat treatment performed at 800° C.+1000° C., or 900° C.+1000° C.), and performed as the preceding stage of the heat treatment aside therefrom.

Therefore, when it is necessary to form a DZ layer and oxide precipitates of sufficient density before loading a wafer into a device fabrication process, it is enough to subject a wafer obtained according to the present inventive method (a wafer subjected to RTA treatment+post annealing) to oxygen precipitation heat treatment as described above.

Furthermore, when both of a DZ layer and oxide precipitates are formed by heat treatment during a device fabrication process, it is enough to directly load the wafer into a device fabrication process without special oxygen precipitation heat treatment.

Figure 8:
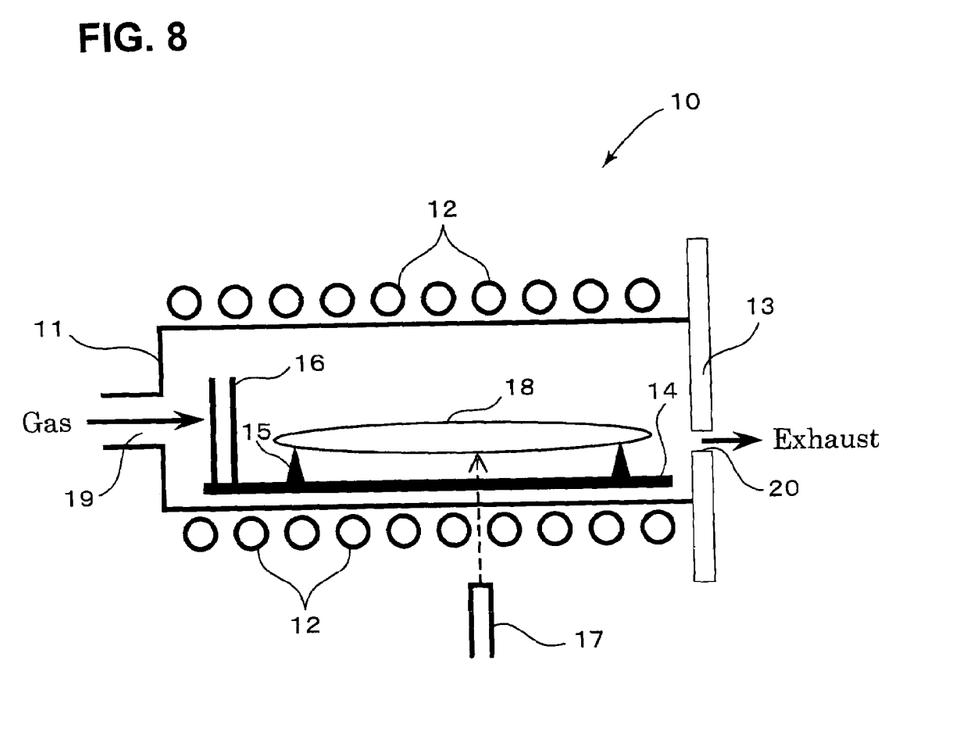
FIG. 8 is a schematic explanatory view showing an example of rapid heating-rapid cooling apparatus (RTA apparatus).

In the method of the present invention, as a representative of an apparatus capable of rapid heating-rapid cooling a silicon wafer, there can be exemplified a lamp heating apparatus with heat radiation. Description will be given of an example of a rapid heating-rapid cooling apparatus (RTA apparatus) preferably used in the method of the present invention with reference to FIG. 8. FIG. 8 is a schematic explanatory view showing an example of an RTA apparatus.

In FIG. 8, a reference numeral 10 designates a heat treatment apparatus, that is, an RTA apparatus. The heat treatment apparatus 10 has a chamber 11 made of quartz and a wafer 18 is heat-treated in the chamber 11. Heating is performed with heat lamps 12 arranged such that the chamber 11 is surrounded from the upper, lower, left and right sides. The heating lamps can be individually controlled by electric power supplied thereto independently from each other.

A gas introduction port 19 is provided at the gas introduction side of the chamber 11 and an auto-shutter 13 is equipped at the exhaust side to seal the chamber from the outside air. To the auto-shutter 13, there is provided a wafer insertion opening not shown designed so as to be openable by a gate valve. Furthermore, to the auto-shutter 13, there is also provided a gas exhaust port 20 so as to adjust furnace atmosphere.

The wafer 18 is placed on a three-point support 15 formed on a quartz tray 14. At the side of the gas introduction port of the quartz tray 14, there is provided a quartz buffer 16 that is capable of preventing gas introduced from the gas introduction port 19 from impinging against the wafer 18 directly.

A special window for temperature measurement not shown is provided to the chamber 11 and a temperature of the wafer 18 can be measured through the special window by a pyrometer 17 disposed outside of the chamber 11.

With the heat treatment furnace 10 as described above, treatment for rapid heating-rapid cooling the wafer 18 is performed as follows:

First, using a wafer-handling device not shown disposed adjacent to the heat treatment apparatus 10, the wafer 18 is loaded through the wafer loading opening not shown into the chamber 11 and placed on the quartz tray 14, and thereafter, the auto-shutter 13 is closed. Then, electric power is supplied to the heating lamps 12 to heat the wafer 18 to a prescribed temperature, for example, of 1100 to 1350° C. On this occasion, a time required for reaching a target temperature is, for example, on the order of 20 sec.

Next, by keeping the temperature for a prescribed time, the wafer 18 is subjected to high temperature heat treatment. When the high temperature treatment ends after elapse of the prescribed time, output of the heating lamps 12 is reduced to lower a temperature of the wafer 18. The temperature lowering operation can be completed, for example, in about 20 sec. Finally, the wafer 18 is unloaded using the wafer handling device to complete the heat treatment.

Further, no specific limitation is put on a heat treatment furnace performing post annealing, but there may be used a vertical furnace, a horizontal furnace or the like of a heater heating type, which has generally been used.

There is not necessarily made clear the reason why it can be realized that by RTA treatment+post annealing BMD density is increased and at the same time DZ layer width is widen, but since it has been known that a concentration of atomic vacancies exerts an influence on oxygen precipitation, it is inferred that a concentration of atomic vacancies in a wafer has a close relation with the mechanism in the method of the present invention. Description will be given of the inference on the mechanism of the method of the present invention below with the reference to FIG. 7.

Figure 7:
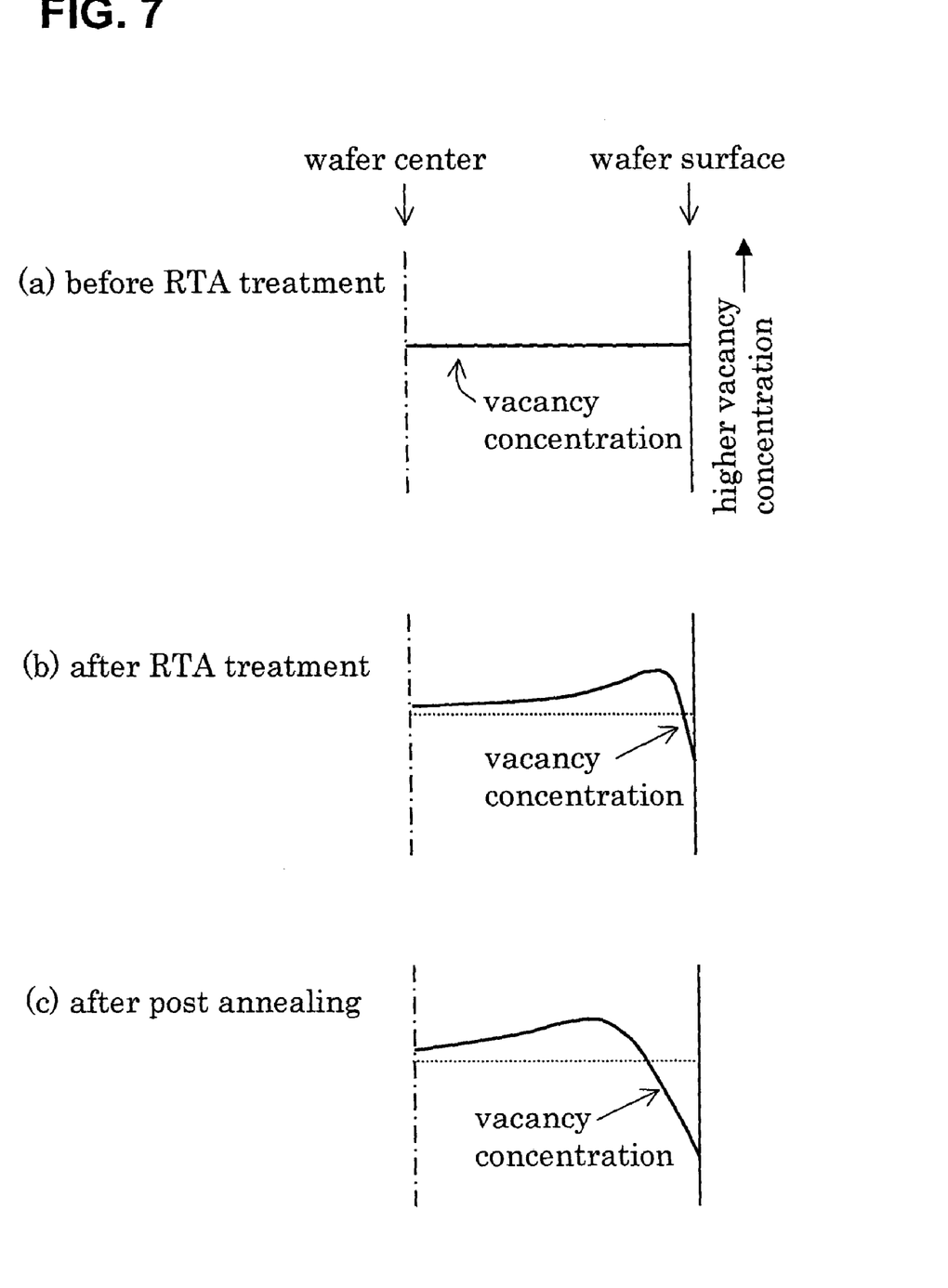
FIG. 7 is a sectional explanatory view of a silicon wafer for illustrating an inference on the mechanism of the present inventive method, wherein part (a) shows a state before RTA treatment, part (b) after the RTA treatment and part (c) after post annealing, respectively.

FIG. 7(a) shows a section of a silicon wafer having interstitial oxygen used in the present invention. For example, in case of a silicon wafer manufactured from an as-grown CZ crystal, since no special heat treatment is applied except heat treatment for annihilation of oxygen donors that is commonly used, it is considered that a vacancy concentration in a wafer is almost constant in a depth direction.

When RTA treatment is applied to the wafer, atomic vacancies are injected into the wafer through a wafer surface, so that a maximum position of a vacancy concentration is produced at a depth of about 10 μm below the wafer surface (FIG. 7(b)). The reason why the maximum vacancy concentration is not at the outermost surface of the wafer is considered such that the vacancies outdiffuse through the wafer surface during the cooling stage of the RTA treatment. Further, the maximum concentration and the maximum position change dependent on RTA treatment conditions (temperature, time and atmosphere).

As can be understood from an experiment shown in Experimental Example 1 described later, an optimal value are present for RTA temperature in order to maximize an amount of precipitated oxygen and BMD density. Considering the fact that vacancies are injected by the RTA treatment and the vacancy concentration affects an amount of precipitated oxygen, the existence of the optimal RTA temperature can be put in another way that an optimal vacancy concentration exists for achieving the maximums of an amount of precipitated oxygen and BMD density.

Therefore, it is conceivable that by performing the RTA treatment, atomic vacancies are injected into a wafer and as a result, a vacancy concentration approaches an optimal value thereof to maximize an amount of precipitated oxygen and BMD density and thereby an amount of precipitated oxygen and BMD density are increased. However, by performing only the RTA treatment, a vacancy concentration increases in the vicinity of a wafer surface where a DZ layer is to be formed, resulting in narrow width of the DZ layer.

Accordingly, in the method of the present invention, after the above RTA treatment, post annealing is performed such that by outdiffusing vacancies in the vicinity of a wafer surface, the vacancies are decreased, and by in-diffusing vacancies in an inner portion thereof, the maximum position of the vacancy concentration is moved from the vicinity of the wafer surface into the inside thereof By performing this post annealing, the maximum position of the vacancy concentration moves into the inside of the wafer as shown in FIG. 7(c), so that a region with a low vacancy concentration is broadened, and as a result it is possible to widen DZ layer width. On the other hand, it is inferred that in the inside of the wafer, a vacancy concentration approaches an optimal value leading to the maximum value of an amount of precipitated oxygen, and hence the amount of precipitated oxygen and BMD density are increased. Furthermore, outdiffusion of interstitial oxygen atoms in the vicinity of a wafer surface occurs simultaneously during the post annealing, as a result leading to increase in the DZ layer width.

In the method of the present invention, the RTA treatment is preferably performed at a temperature higher than an optimal temperature at which an amount of precipitated oxygen and BMD density are maximized. The reason is inferred as follows:

That is, when the RTA treatment is performed at the optimal temperature, vacancies are injected into a wafer so as to attain an optimal vacancy concentration at which an amount of precipitated oxygen or BMD density in a region of a specific depth in the bulk is maximized.

In such a case, by performing the post annealing as in the present invention, there are some cases where a concentration of injected vacancies decreases, so that the maximum values of an amount of precipitated oxygen or BMD density cannot be achieved.

Then, by selecting as an RTA temperature a temperature somewhat (for example, on the order of 10 to 30° C.) higher than an optimal temperature at which an amount of precipitated oxygen or BMD density comes to the maximum value, it is preferable to inject vacancies at a concentration higher than an optimal value thereof.

With the condition mentioned above, when the post annealing is performed, vacancies injected in excess of an optimal vacancy concentration at which an amount of precipitated oxygen or BMD density is maximized diffuse into a further inner portion of the bulk; the maximum concentration of vacancies is reduced to approach an optimal value thereof, and a vacancy concentration in the further inner portion of the bulk is increased, thereby an amount of precipitated oxygen in the region being increased. On the other hand, since vacancies in the vicinity of a wafer surface outdiffuse, no influence is exerted on formation of a DZ layer to achieve a wide DZ layer.

EXAMPLES

Example 1

There were prepared silicon wafers manufactured from a silicon ingot pulled by means of a Czochralski method, each having a diameter of 200 mm, an initial interstitial oxygen concentration of 12 ppma (JEIDA), a conductivity type of p type and resistivity of 10 Ωcm, and the wafers were subjected to RTA treatment and post annealing under conditions shown in Table 1.

The RTA treatment was performed using an SHS-2800 type heating furnace (made by Steag Microtech International) and post annealing was performed using a common heater heating type of horizontal furnace, wherein neither ramp up nor ramp down was adopted and the wafers were loaded into or unloaded from the respective furnaces kept at each heat treatment temperature at a rate of 10 cm/min.

TABLE 1

|  | Atmosphere | Heat treatment temperature | Heat treatment time |
| --- | --- | --- | --- |
| RTA treatment | 100% nitrogen | 1220° C. | 30 sec |
| Post annealing | 100% nitrogen | 700° C., 800° C., 900° C., 950° C., 1000° C., 1050° C. | 2 hrs |

Figure 1:
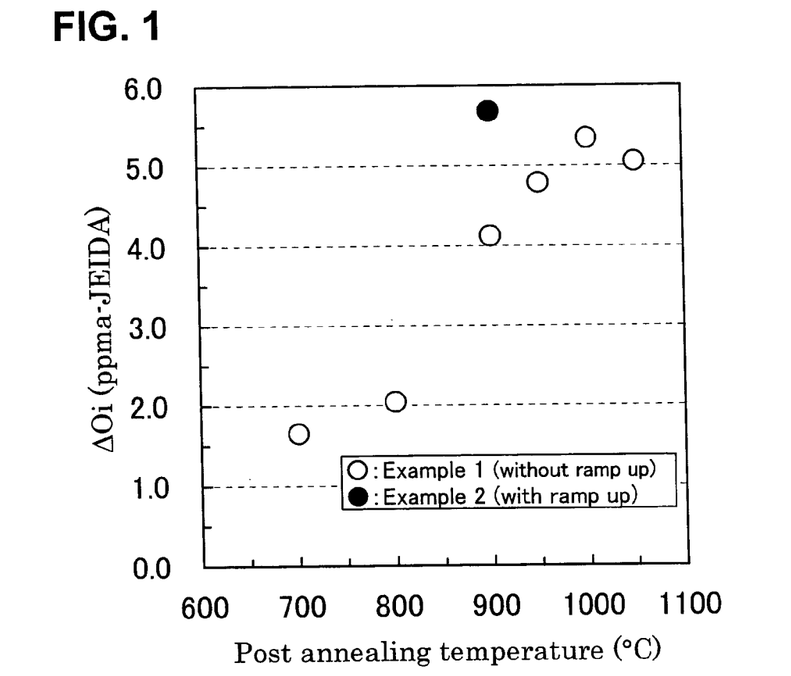
FIG. 1 is a graph showing a relationship between a post annealing temperature and an amount of precipitated oxygen in each of Examples 1 and 2.
Figure 2:
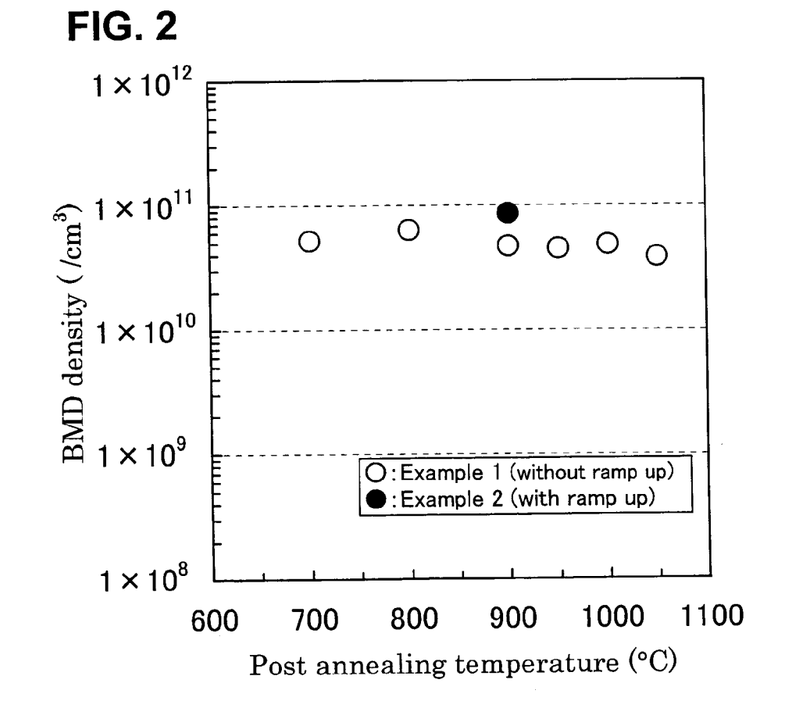
FIG. 2 is a graph showing a relationship between a post annealing temperature and BMD density in each of Examples 1 and 2.
Figure 3:
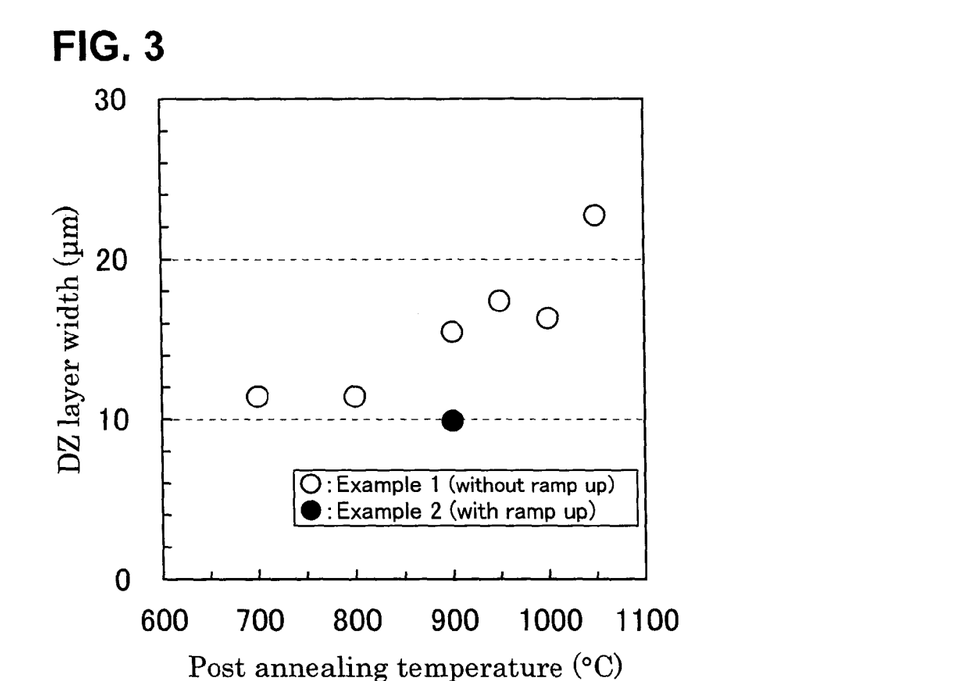
FIG. 3 is a graph showing a relationship between a post annealing temperature and DZ layer width in each of Examples 1 and 2.

Wafers subjected to the RTA treatment and post annealing were further subjected to heat treatment (800° C., 4 hrs+ 1000° C., 16 hrs) to grow oxide precipitates and thereafter, residual interstitial oxygen concentrations were measured by means of an infrared spectroscopy on the wafers to calculate amounts of precipitated oxygen (ΔOi), which were plotted in a graph of FIG. 1 (indicated by white circles in FIG. 1). Furthermore, angle polishing was applied on a surface of each wafer and then preferential etching was applied thereon to observe the etched surface with an optical microscope and inspect the maximum BMD density in a depth direction of each wafer (a position of about 20 to 30 μm below a wafer surface) and DZ layer width, which were shown in graphs of FIGS. 2 and 3 (indicated by white circles in each of the figures).

Example 2

Wafers of the same specifications as those in Example 1 were used and subjected to the RTA treatment same as in Example 1, thereafter post annealing was applied in a way that the wafers were loaded into a furnace kept at 700° C., a temperature of the furnace was ramped up to 900° C. at a rate of 10° C./min, heat treatment was performed at the temperature in 100% nitrogen atmosphere for 2 hrs followed by ramping-down to 700° C. at a rate of 2° C./min and thereafter the wafers were unloaded. Heat treatment to generate oxide precipitates was applied to the wafers and thereafter evaluations (ΔOi, BMD density and DZ layer width) similar to those in Example 1 were performed and shown in graphs of FIGS. 1 to 3 (indicated by black circles in each of the figures) together with evaluations of Example 1.

Note that the reason why 1220° C. was selected as the RTA temperature in Examples 1 and 2 is that it was confirmed from the following experiments that an optimal temperature at which ΔOi and BMD density were maximized was 1200° C.

Experimental Example 1

Figure 4:
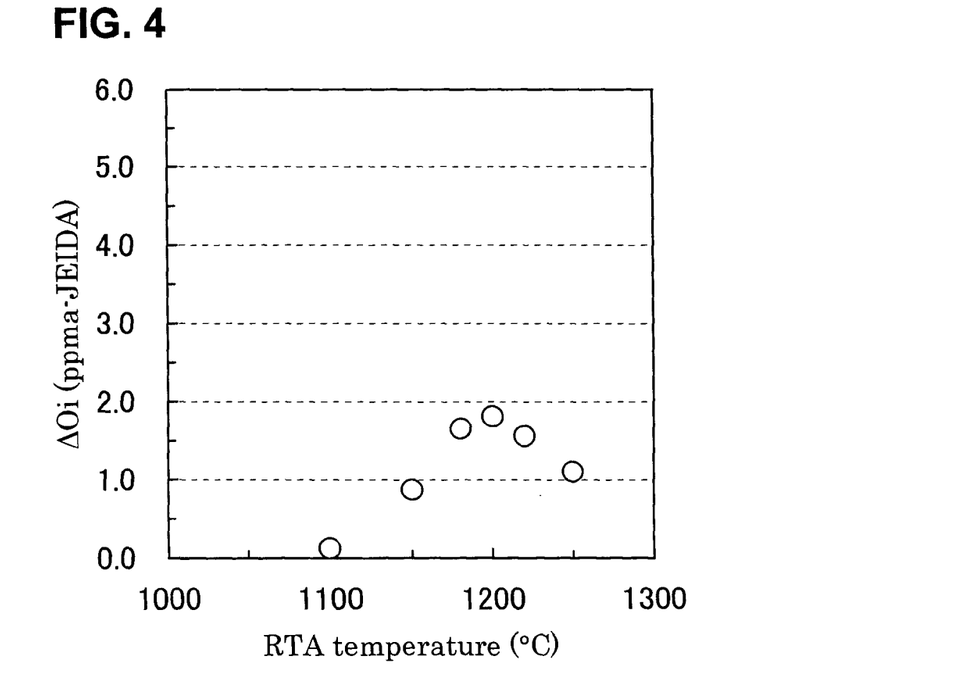
FIG. 4 is a graph showing a relationship between an RTA temperature and an amount of precipitated oxygen in Experimental Example 1.
Figure 5:
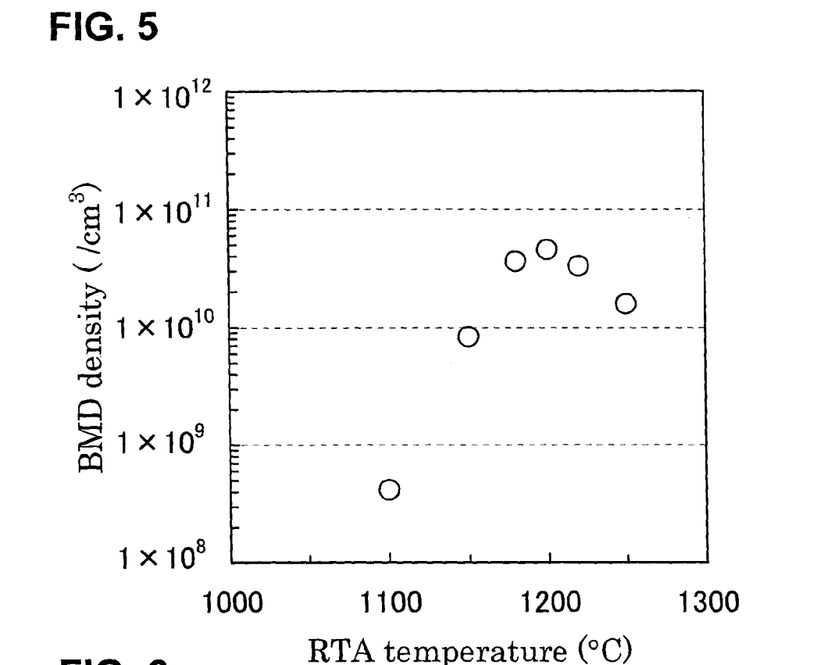
FIG. 5 is a graph showing a relationship between an RTA temperature and BMD density in Experimental Example 1.
Figure 6:
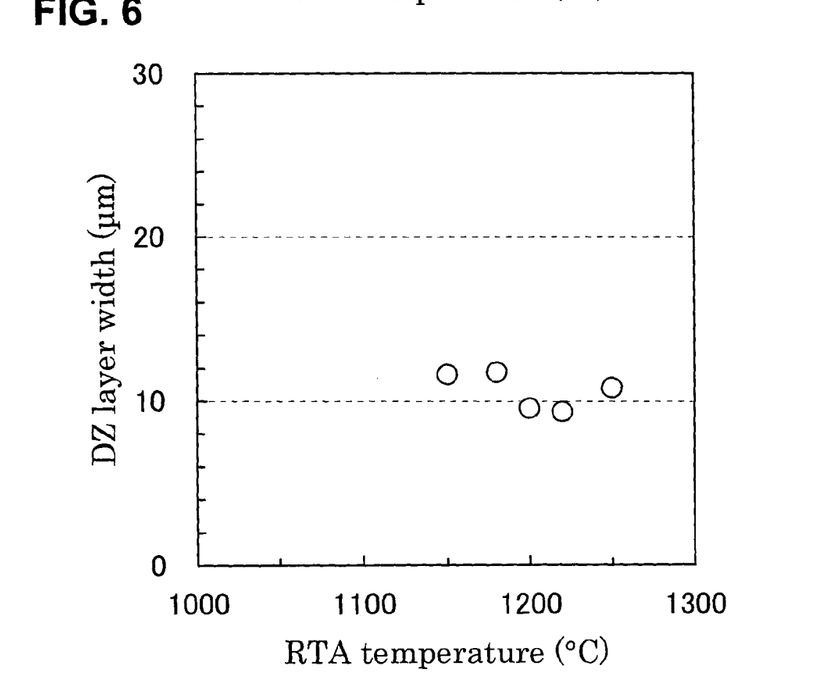
FIG. 6 is a graph showing a relationship between an RTA temperature and an amount of DZ layer width in Experimental Example 1.

Wafers with the same specifications those in Example 1 were used and subjected to only the RTA treatments under conditions shown in Table 2, followed by heat treatment (800° C., 4 hrs+1000° C., 16 hrs) to grow oxide precipitates, and thereafter evaluations (ΔOi, BMD density and DZ layer width) similar to those in Example 1 were performed and shown in graphs of FIGS. 4, 5 and 6.

TABLE 2

|  | Atmosphere | Heat treatment temperature | Heat treatment time |
| --- | --- | --- | --- |
| RTA treatment | 100% nitrogen | 1100° C., 1150° C., 1180° C., 1200° C., 1220° C., 1250° C. | 30 sec |

Example 3

There were prepared silicon wafers manufactured from a silicon ingot pulled by means of a Czochralski method, each having a diameter of 200 mm, an initial interstitial oxygen concentration of 13 ppma (JAIDA), a conductivity type of p-type, resistivity of 10 Ωcm and a whole surface of an N-region, and the wafers were subjected to RTA treatment and post annealing (1050° C.). Then, heat treatment to grow oxide precipitates was applied to the wafers and thereafter evaluations (ΔOi, BMD density and DZ layer width) similar to those in Example 1 were performed, followed by measurement on COP density for COPs of 0.1 μm or more in diameter on a wafer surface, and results of the evaluations were shown in Table 3.

TABLE 3

| Evaluation items | Results of evaluation |
| --- | --- |
| ΔOi | 5.1 ppma |
| BMD density | $5.0 \times 10^{10}/cm^3$ |
| DZ layer width | 23 μm |
| COP density | 0.15 pieces/cm$^2$ |

The following is deduced from the results of Examples 1 to 3 and Experimental Example 1. At first, where only the RTA treatments were applied in Experimental Example 1, there exists an optimal temperature for the RTA temperatures to attain the maximum BMD density, and the DZ layer width shows the minimum value at a temperature (1200° C.) at which the BMD density (and ΔOi) takes the maximum value. That is, it was confirmed that there are inverse correlations between the BMD density and the DZ layer width. Here, the BMD density at an optimal temperature (1200° C.) to attain the maximum BMD density was $4.5 \times 10^{10}/cm^3$ and the DZ layer width was 9.6 μm.

Note that it was confirmed in a different experiment that when an RTA treatment time in Experimental Example 1 is changed from 30 sec to 10 sec, an optimal temperature to attain the maximum BMD density rises from 1200° C. to 1280° C.

On the other hand, by applying post annealing (without ramp up and ramp down) after an RTA treatment as in Examples 1 and 3, the maximum BMD density was increased to 4 to $6.5 \times 10^{10}/cm^3$, and the DZ layer width was widened to at least 11 μm. It was further found that especially at a temperature of post annealing of 900° C. to 1050° C., the DZ layer width was a minimum of 15 μm and increased up to a maximum of 23 μm.

It was further found that when the ramp up and ramp down were performed in the post annealing as in Example 2, the DZ layer width was 9.9 μm with some increase, but the BMD density was increased to an extremely high value of $8.6 \times 10^{10}/cm^3$.

Capability of Exploitation in Industry:

According to the method of the present invention, as described above, a silicon wafer having widened DZ layer width as well as increased BMD density can be manufactured. Moreover, a silicon wafer of the present invention has large BMD density and wide DZ layer width.

The invention claimed is:

1. A method for manufacturing a silicon wafer comprising the steps of:
    performing heat treatment (RTA treatment) to a silicon wafer containing interstitial oxygen with a rapid heating-rapid cooling apparatus, thereby atomic vacancies being injected from a surface of the wafer to form a maximum position of an atomic vacancy concentration in a depth direction in the vicinity of the surface of the wafer; and
    performing heat treatment (post annealing) to move the maximum position of the atomic vacancy concentration in the vicinity of the surface of the wafer into the inside of the wafer,
    wherein the RTA treatment is performed in an atmosphere containing nitrogen in a temperature range of 1100 to 1350° C.,
    wherein the post annealing is performed in a temperature range of 700 to 1050° C., and
    wherein the RTA treatment is performed at a temperature higher than an optimal temperature at which an amount of precipitated oxygen or BMD density is maximized, and wherein the optimal temperature at which the amount of precipitated oxygen or the BMD density is maximized is determined by providing plural silicon wafers prepared under the same conditions as the silicon wafer containing interstitial oxygen, subjecting each wafer thereof to the RTA treatment at respective plural different temperatures selected in the temperature range of 1100° C. to 1350° C., and thereafter applying oxygen precipitation treatment to the plural silicon wafers subjected to the RTA treatment, to obtain a relationship between the amount of precipitated oxygen or the BMD density and an RTA treatment temperature.

2. The method for manufacturing a silicon wafer according to claim 1, wherein the post annealing performed in the temperature range of 700 to 1050° C. is performed by loading a silicon wafer into a heat treatment furnace kept at a specific temperature in the temperature range.

3. The method for manufacturing a silicon wafer according to claim 1, wherein a CZ silicon wafer which has the entire surface composed of an N-region is used as the silicon wafer containing interstitial oxygen.

4. The method for manufacturing a silicon wafer according to claim 2, wherein a CZ silicon wafer which has the entire surface composed of an N-region is used as the silicon wafer containing interstitial oxygen.

* * * * *